United States Patent
Bao et al.

(10) Patent No.: US 9,412,654 B1
(45) Date of Patent: Aug. 9, 2016

(54) GRAPHENE SACRIFICIAL DEPOSITION LAYER ON BEOL COPPER LINER-SEED FOR MITIGATING QUEUE-TIME ISSUES BETWEEN LINER AND PLATING STEP

(71) Applicant: International Business Machines Corporation, Armonk, NY (US)

(72) Inventors: Junjing Bao, San Diego, CA (US); Lawrence A. Clevenger, LaGrangeville, NY (US); Vincent J. McGahay, Poughkeepsie, NY (US); Joyeeta Nag, Wappingers Falls, NY (US); Richard S. Wise, Los Altos, CA (US); Yiheng Xu, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/697,056

(22) Filed: Apr. 27, 2015

(51) Int. Cl.
*H01L 21/4763* (2006.01)
*H01L 21/44* (2006.01)
*H01L 21/768* (2006.01)

(52) U.S. Cl.
CPC .... *H01L 21/76876* (2013.01); *H01L 21/76843* (2013.01)

(58) Field of Classification Search
CPC ......... H01L 21/76; H01L 21/44; H01L 21/28; H01L 23/52
USPC ............ 438/627, 653, 618, 479; 257/29, 750, 257/751, E23.165, E29.336, E23.019
See application file for complete search history.

(56) References Cited

U.S. PATENT DOCUMENTS

| | | | |
|---|---|---|---|
| 7,235,487 B2 | 6/2007 | Barkyoumb et al. |
| 8,242,017 B2 | 8/2012 | Xiang et al. |
| 8,410,608 B2 | 4/2013 | Wada et al. |
| 8,476,765 B2 | 7/2013 | Zhang et al. |
| 8,610,278 B1 | 12/2013 | Ott et al. |

(Continued)

OTHER PUBLICATIONS

Li, X. et al, "Large-Area Synthesis of High-Quality and Uniform Graphene Films on Copper Foils" Science (Jun. 2009) pp. 1312-1314, vol. 324.

(Continued)

*Primary Examiner* — Yuanda Zhang
*Assistant Examiner* — Sheikh Maruf
(74) *Attorney, Agent, or Firm* — Scully, Scott, Murphy & Presser, P.C.; Steven J. Meyers (57) ABSTRACT

After forming a copper seed layer on a diffusion barrier layer present on sidewalls and a bottom surface of at least one opening, a graphene sacrificial layer is deposited over the copper seed layer before the copper seed layer is exposed to an environment that oxidizes the copper seed layer, thus providing process flexibility for longer queue times (Q-times) between copper seed layer deposition and copper plating. Next, the graphene sacrificial layer is subjected to a plasma treatment to introduce disorders and defects into the graphene sacrificial layer for removal just before the copper plating. The entire structure is then immersed in a copper plating solution. The copper plating solution dissolves the plasma treated graphene sacrificial layer and forms a copper-containing layer on the re-exposed copper seed layer.

20 Claims, 5 Drawing Sheets

(56) References Cited

U.S. PATENT DOCUMENTS

| | | | |
|---|---|---|---|
| 2009/0117733 A1 | 5/2009 | Dubin et al. | |
| 2010/0127358 A1* | 5/2010 | Tanaka | H01L 27/1021 257/656 |
| 2011/0006425 A1* | 1/2011 | Wada | H01L 21/76807 257/750 |
| 2011/0049718 A1* | 3/2011 | Matsumoto | C23C 16/40 257/751 |
| 2012/0080661 A1* | 4/2012 | Saito | H01L 21/76876 257/29 |
| 2012/0080662 A1* | 4/2012 | Saito | H01L 21/28556 257/29 |
| 2012/0080796 A1* | 4/2012 | Wada | H01L 21/76834 257/762 |
| 2012/0139114 A1* | 6/2012 | Zhang | H01L 21/76849 257/751 |
| 2012/0228614 A1* | 9/2012 | Kitamura | H01L 21/02491 257/52 |
| 2012/0264288 A1* | 10/2012 | Furuya | H01L 21/2885 438/627 |
| 2013/0113102 A1 | 5/2013 | Bao et al. | |
| 2013/0299988 A1* | 11/2013 | Bonilla | H01L 21/76877 257/751 |
| 2014/0127896 A1 | 5/2014 | Bonilla et al. | |
| 2014/0145332 A1* | 5/2014 | Ryan | H01L 23/53238 257/751 |

OTHER PUBLICATIONS

Choi, J.H. et al., "Drastic reduction in the growth temperature of graphene on copper via enhanced London dispersion force" Scientific Reports (May 2013) pp. 1-6, vol. 3, No. 1925.

Zhang, B. et al., "Low-Temperature Chemical Vapor Deposition Growth of Graphene from Toluene on Electropolished Copper Foils" ACS Nano (Feb. 2012) pp. 2471-2476, vol. 6, No. 3.

Kumar, A. et al., "Rapid synthesis of few-layer graphene over Cu foil" Carbon (Nov. 2012) pp. 1546-1553, vol. 50.

Chen, S. et al., "Oxidation resistance of graphene-coated Cu and Cu/Ni alloy" ACS Nano (Jan. 2011) pp. 1321-1327, vol. 5, No. 2.

Li, Z. et al., "Low temperature growth of graphene by CVD using solid and liquid carbon sources" ACS Nano (Mar. 2011) pp. 3385-3890, vol. 5, No. 4.

Rasool, H.I. et al., "Continuity of Graphene on Polycrystalline Copper" Nanoletters (2011) pp. 251-256, vol. 11, with additional Supporting Online Information, pp. 1-5.

Prasai, D. et al, "Graphene: Corrosion inhibiting coating" ACS Nano (Feb. 2012) pp. 1102-1108, vol. 6, No. 2.

* cited by examiner

GRAPHENE SACRIFICIAL DEPOSITION LAYER ON BEOL COPPER LINER-SEED FOR MITIGATING QUEUE-TIME ISSUES BETWEEN LINER AND PLATING STEP

BACKGROUND

The present application relates to the formation of copper interconnect structures for semiconductor devices and, more particularly to a method of protecting a copper seed layer from oxidation, agglomeration and corrosion during a queue time (Q-time) between copper deposition and copper plating.

Integrated circuits (ICs) commonly use copper interconnects to connect semiconductor devices such as, for example, transistors, on the ICs. These interconnects are typically formed using a damascene process in which a dielectric material layer is patterned to include at least one opening therein. Copper is subsequently deposited within the opening by electrochemical deposition and thereafter any copper that is located outside the opening can be removed via a planarization process. A copper seed layer is necessary to initiate the electrochemical deposition of copper. Because copper readily oxides when exposed to air, the Q-time (i.e., waiting time) between the copper seed layer deposition and the bulk copper electrochemical deposition has to be very short; otherwise, the copper seed layer may get oxidized, leading to corrosion and agglomeration of the copper in the seed layer. In addition, copper oxide readily dissolves in the plating solution, causing discontinuities in the copper seed layer. These discontinuities in the copper seed layer generate voids and/or plating defects in the copper layer plated over the copper seed layer, resulting in increased yield losses, device failures and reliability problems. Furthermore, the short Q-time makes on-product measurements of the copper seed layer impossible. Therefore, a method is needed to prevent oxidation of the copper seed layer and allow a longer Q-time between copper seed layer deposition and copper plating.

SUMMARY

The present application provides a method to prevent oxidation of a copper seed layer in the formation of copper interconnect structures by forming a graphene sacrificial layer on the copper seed layer immediately after copper seed deposition and before copper plating. After forming a copper seed layer on a diffusion barrier layer present on sidewalls and a bottom surface of at least one opening, a graphene sacrificial layer is deposited over the copper seed layer before the copper seed layer is exposed to an environment that oxidizes the copper seed layer, thus providing process flexibility for longer Q-times between copper seed deposition and copper plating. Next, the graphene sacrificial layer is subjected to a plasma treatment to introduce disorders and defects into the graphene sacrificial layer for removal just before the copper plating. The entire structure is then immersed in a copper plating solution. The copper plating solution dissolves the plasma treated graphene sacrificial layer and forms a copper-containing layer on the re-exposed copper seed layer. The graphene sacrificial layer allows prolonged Q-time between copper seed layer deposition and copper plating which gives more flexibility to production flow.

In one aspect of the present application, a method of forming an interconnect structure is provided. The method includes first forming at least one opening in at least one dielectric material layer. A copper seed layer is then formed on sidewalls and a bottom surface of the at least one opening. After forming a graphene sacrificial layer on the copper seed layer the graphene sacrificial layer is subjected to a plasma treatment. Next the plasma treated graphene sacrificial layer is contacted with a copper plating solution. The copper plating solution dissolves the plasma treated graphene sacrificial layer and forms a copper-containing layer on the copper seed layer to fill the at least one opening.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
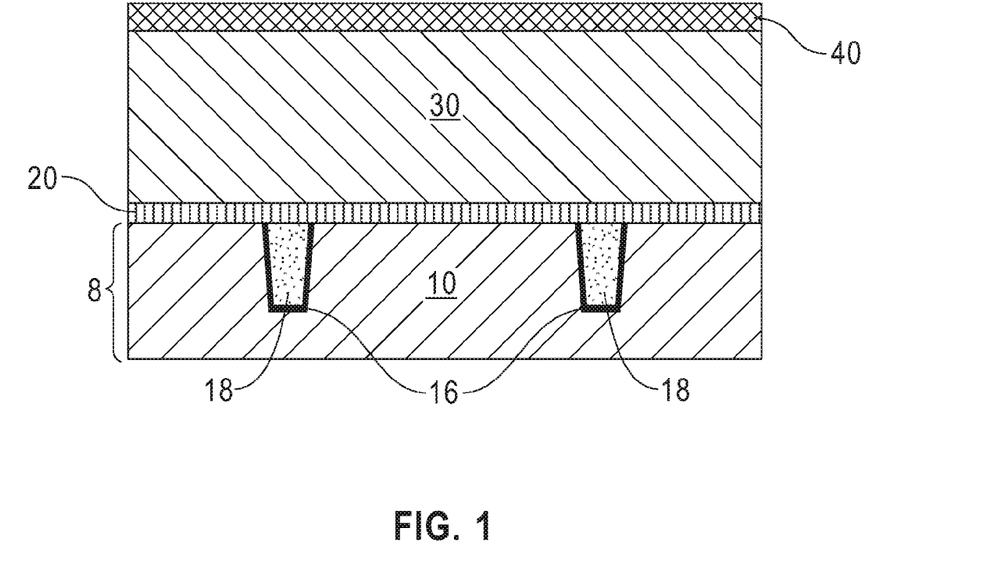
FIG. 1 is a cross-sectional view of an exemplary semiconductor structure after forming a stack of material layers over a lower level interconnect structure in accordance with an embodiment of present application.

Referring to FIG. 1, an exemplary semiconductor structure according to one embodiment of the present application includes a lower level interconnect structure 8 and a stack of material layers formed thereupon. The lower level interconnect structure 8 is typically formed on a semiconductor substrate (not shown) containing semiconductor devices such as field effect transistors (not shown). The lower level interconnect structure 8 may include a first dielectric material layer 10 and first conductive structures 18 embedded therein. The first conductive structures 18 are separated from the first dielectric material layer 10 by first diffusion barriers 16.

The first dielectric material layer 10 typically includes a low-k dielectric material. By "low-k" it is meant a dielectric material having a dielectric constant that is about 4.0 or less. Exemplary low-k dielectric materials include, but are not limited to, silicon dioxide, organosilicates, silsequioxanes, undoped silicate glass (USG), fluorosilicate glass (FSG), and borophosphosilicate glass (BPSG). The first dielectric material layer 10 may be formed on the topmost surface of the substrate (not shown) utilizing any conventional deposition process including, for example, chemical vapor deposition (CVD), plasma enhanced chemical vapor deposition (PECVD), evaporation, chemical solution deposition or spin coating. The first dielectric material layer 10 that is formed may have a thickness from 100 nm to 1,000 nm, although lesser and greater thicknesses can also be employed.

Following the formation of the first dielectric material layer 10, the first dielectric material layer 10 is subsequently patterned by lithography (applying a photoresist, exposing the applied photoresist to a desired pattern of radiation and development) and etching (dry etching, wet etching or a combination thereof) to provide openings (not shown) within the first dielectric material layer 10 within which the first conductive structures 18 will be subsequently formed. The openings may be via openings, line openings or combinations of via and line openings. In some embodiments, the combined via and line opening may be formed one directly atop the other such that the two openings are in electrical communication with each other. The patterning of the first dielectric material layer 10 may occur with a hard mask (not shown) located on the top surface of the first dielectric material layer 10. The hard mask is typically removed after filling the at least one opening with a conductive material and subjecting the structure to planarization. During the etching process, the patterned photoresist can be removed (via a conventional stripping process) after transferring the pattern into at least the hard mask.

Next, a first diffusion barrier 16 is formed on the exposed surfaces of the first dielectric material layer 10 within each of the openings. The first diffusion barrier 16 may include Ta, TaN, TiN, Ru, RuN, RuTa, RuTaN, W, WN, Co, any combinations thereof or any other material that can serve as a barrier to prevent conductive material from diffusing therethrough. The first diffusion barrier 16 may be formed by a conventional deposition process including, for example, CVD, PECVD, atomic layer deposition (ALD), physical vapor deposition (PVD), sputtering, chemical solution deposition or plating. The first diffusion barrier 16 that is formed may have a thickness from about 4 to about 40 nm, although lesser and greater thicknesses can also be employed.

After lining the openings with the first diffusion barrier 16, the first conductive structures 18 are formed by depositing a conductive material to fill the openings. The conductive material which is used in forming the first conductive structures 18 may include polysilicon, a conductive metal such as, for example, Cu, W, Co or Al, an alloy comprising at least one conductive metal, a conductive metal silicide or combinations thereof. The conductive material may be deposited utilizing a conventional deposition process including, but not limited to, CVD, PECVD, sputtering, chemical solution deposition or plating.

After deposition, a conventional planarization process such as, for example, chemical mechanical polishing (CMP) can be used to provide a structure in which each of the first diffusion barrier 16 and the first conductive structures 18 has an upper surface that is coplanar with the top surface of the first dielectric material layer 10.

The stack of material layers formed on the topmost surfaces of the lower level interconnect structure 8 may include, for example, a first dielectric cap layer 20, a second dielectric material layer 30 and a dielectric hard mask layer 40.

The first dielectric cap layer 20 can protect underlying lower level interconnect structure 8 from impurities that may diffuse down from upper levels, and can function as a diffusion barrier layer that prevents vertical diffusion of metallic impurities, moisture, or other gaseous impurities. The first dielectric cap layer 20 may include, for example, silicon nitride, silicon oxynitride, silicon carbide, a nitrogen and hydrogen doped silicon carbide (SiCNH), or a combination thereof. The first dielectric cap layer 20 may be formed, for example, by CVD or ALD. The thickness of the first dielectric cap layer 20 can be from 25 nm to 50 nm, although lesser and greater thicknesses can also be employed.

The second dielectric material layer 30 that is formed on the first dielectric cap layer 20 may include a dielectric material that is the same, or different, from the first dielectric material layer 10. The processing techniques and thickness ranges described above for the first dielectric material layer 10 are also applicable here for the second dielectric material layer 20. The second dielectric material layer 30 may include a low-k dielectric material which can be silicon oxide, organosilicates, silsequioxanes, USG, FSG, or BPSG. The second dielectric material layer 30 may be formed on by CVD, PECVD or spin coating and may have a thickness from 100 nm to 1,000 nm, The dielectric hard mask layer 40 that is formed on the second dielectric material layer 30 can be employed to provide a greater mechanical strength during a subsequent planarization process. Alternately or additionally, the dielectric hard mask layer 40 can be employed as an etch mask for etching the underlying dielectric material layers. The dielectric hard mask layer 40 may include, for example, silicon nitride, silicon oxynitride, organosilicate, or a combination thereof. In one embodiment, the dielectric hard mask layer 40 is composed of tetraethyl orthosilicate (TEOS). The dielectric hard mask layer 40 may be formed, for example, by CVD or ALD. The thickness of the dielectric hard mask layer 40 may be from 15 nm to 50 nm, although lesser and greater thicknesses can also be employed.

Figure 2:
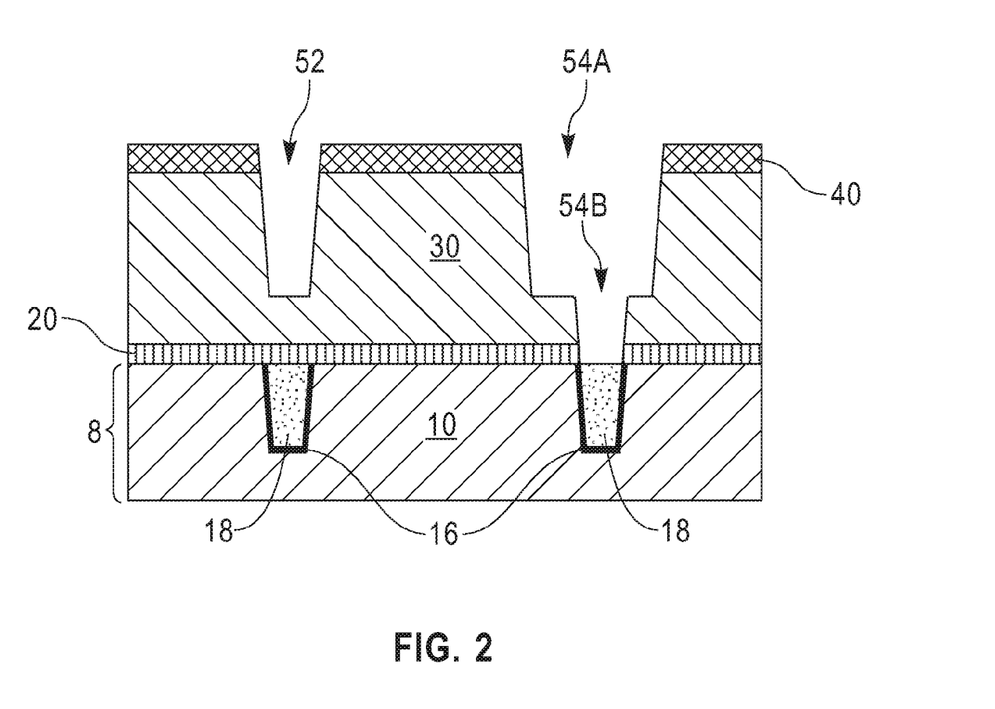
FIG. 2 is a cross-sectional view of the exemplary semiconductor structure of FIG. 1 after forming openings in the stack.

Referring now to FIG. 2, openings are formed in the stack of the material layers (20, 30, 40). The openings may be via openings, line openings, or a combination of a line opening and a via opening. In one embodiment and as shown in FIG. 2, the openings include a first opening 52 which is a line opening for a single damascene structure and a second opening which is a combination of a line opening 54A and a via opening 54B for a dual damascene structure. The first opening 52 extends into the second dielectric material layer 30. The second opening (54A, 54B) extends through the second dielectric material layer 30 and the first dielectric cap layer 20 to expose the top surface of a conductive structure (16, 18).

The first opening 52 and the second opening 54A, 54B may be formed by lithography and etching known in the art. Lithography includes applying a photoresist (not shown) atop the dielectric hard mask layer 40 utilizing CVD, PECVD, spin coating, chemical solution deposition or evaporation. The photoresist is then subjected to a lithographic process which includes exposing the photoresist to a pattern of radiation and developing the exposed resist utilizing a conventional resist developer. The lithographic step provides a patterned photoresist atop the dielectric hard mask layer 40 that defines the width of the opening to be subsequently formed into the second dielectric material layer 30. After providing the patterned photoresist, the pattern is transferred into the dielectric hard mask layer 40 and then subsequently into the second dielectric material layer 30 utilizing one or more etching processes. The patterned photoresist can be stripped immediately after the pattern is transferred into the dielectric hard mask layer 40 forming a patterned dielectric hard mask layer (not shown) utilizing a conventional stripping process, such as, for example, ashing. Alternatively, the patterned photoresist can be stripped after the pattern is transferred into the second dielectric material layer 30. The etching used in transferring the pattern may comprise a dry etching process such as, for example, reactive ion etching (RIE), ion beam etching, plasma etching or laser ablation, a wet chemical etching process, or a combination thereof. In the instance when the combination of a line opening 54A and a via opening 54B is formed, another iteration of lithography and etching is performed. The hard mask(s) can be removed immediately after the line/via openings or left in place for subsequent removal after metallization.

Figure 3:
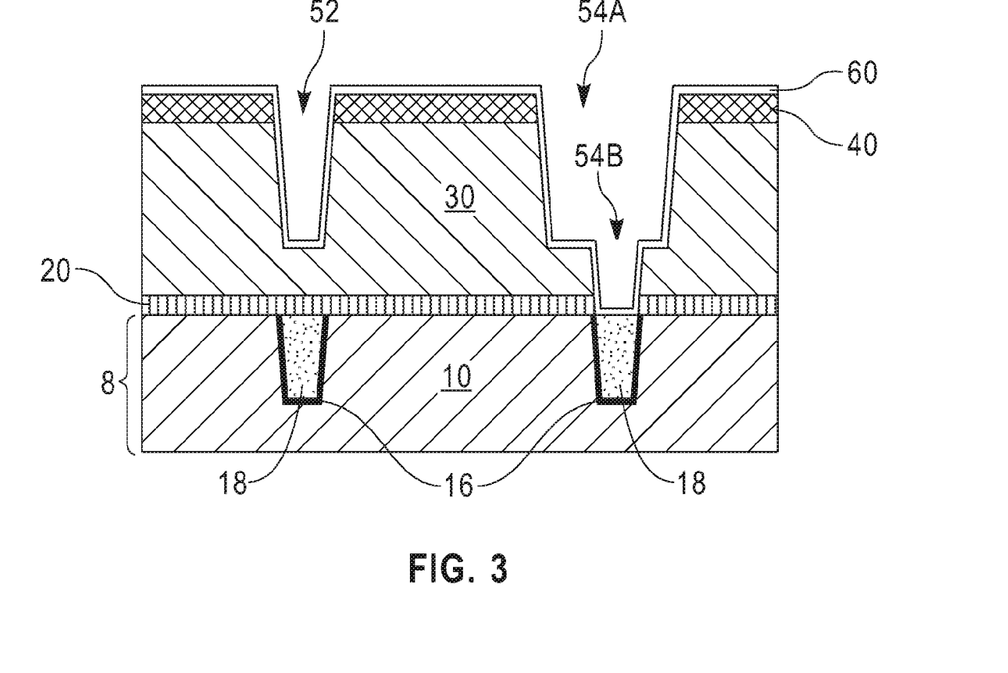
FIG. 3 is a cross-sectional view of the exemplary semiconductor structure of FIG. 2 after forming a second diffusion barrier layer on sidewalls and bottom surfaces of the openings and topmost surfaces of the stack.

Referring to FIG. 3, a diffusion barrier layer (i.e., diffusion barrier liner) 60 is formed over sidewalls and bottom surfaces of the openings 52, 54A, 54B and the top surface of the dielectric hard mask layer 40. The diffusion barrier layer 60 is formed to prevent diffusion of contaminates from and/or into conductive structures to be subsequently formed, as well as to promote adhesion of the conductive structure to the second dielectric material layer 30. The diffusion barrier layer 60 may include Ta, TaN, W, WN, TiN, or a stack thereof such as Ta/TaN, Ta/TaN/Ta and TaN/Ta. In one embodiment, the diffusion barrier layer 60 is a bilayer stack of TaN/Ta. The diffusion barrier layer 60 may be formed, for example, by CVD, ALD, PECVD or PVD. The diffusion barrier layer 60 that is formed have a thickness from 1 nm to 10 nm, although lesser and greater thicknesses can also be employed.

Figure 4:
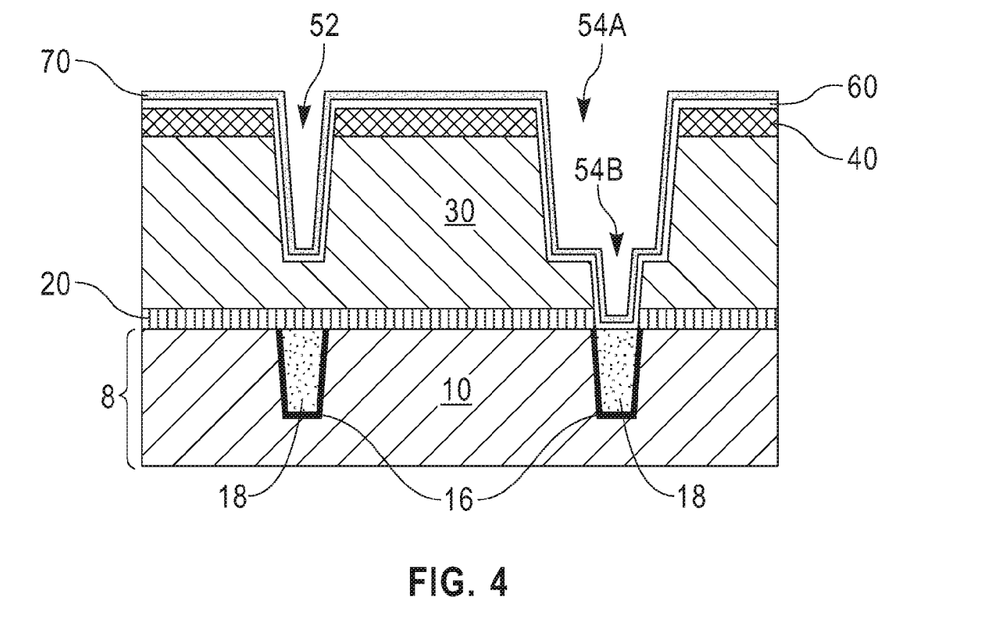
FIG. 4 is a cross-sectional view of the exemplary semiconductor structure of FIG. 3 after forming a copper seed layer on the second diffusion barrier layer.

Referring to FIG. 4, a copper seed layer 70 is formed atop the diffusion barrier layer 60. The copper seed layer 70 is employed to selectively promote subsequent electroplating of a layer of copper or a copper alloy. The copper seed layer 70 may comprise copper or a copper alloy. The copper seed layer 70 may be formed, for example, by CVD, PECVD, ALD, or PVD. The copper seed layer 70 that is formed may have a thickness from 0.5 nm to 10 nm, although lesser and greater thicknesses can also be employed.

Figure 5:
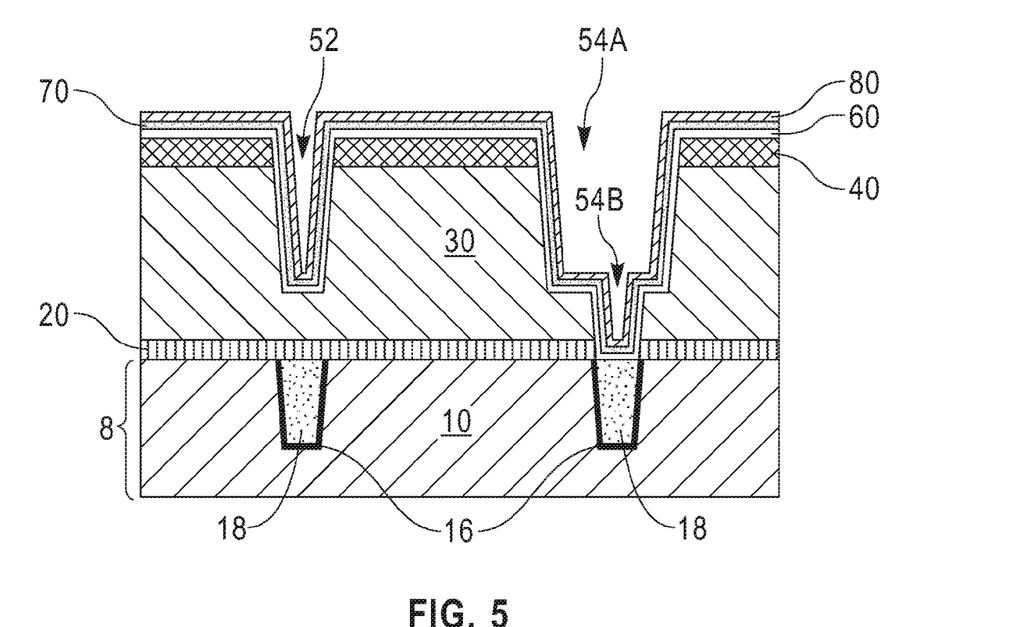
FIG. 5 is a cross-sectional view of the exemplary semiconductor structure of FIG. 4 after forming a graphene sacrificial layer on the copper seed layer.

Referring to FIG. 5, a graphene sacrificial layer 80 is formed atop the copper seed layer 70. The graphene sacrificial layer 80 may consist of a monolayer (normally 0.34 nm thick) or a few monolayers (e.g., 2-10 graphene monolayers) of graphene. The graphene sacrificial layer 80 may be formed, for example, by CVD, PECVD, microwave plasma CVD (MPCVD), or ultraviolet (UV) assisted CVD. The deposition of graphene can be performed at a temperature up to, but not exceeding, 400° C. In one embodiment, the growth of the graphene sacrificial layer 80 occurs at a room temperature and no supplemental substrate heating is required. In one embodiment, the graphene sacrificial layer 80 is epitaxially aligned with the copper seed layer 70. By "epitaxially aligned" it is meant that the graphene sacrificial layer 80 has a same crystal orientation as that of the copper seed layer 70.

Because graphene is chemically inert, thermally conducting, and stable in ambient atmosphere up to 400° C., the graphene sacrificial layer 80 protects the copper seed layer 70 from oxidation, corrosion or agglomeration after the copper seed layer deposition. This prevents the loss of the copper seed layer 70 before the copper plating process, allowing employing a thinner copper seed layer which is highly desirable to avoid overhang and pinch-off of the copper seed layer during the seed layer deposition, especially for small trenches/vias beyond 22 nm node. Furthermore, because the graphene sacrificial layer 80 prevents the oxidation, corrosion or agglomeration of the copper seed layer 70, the limitation on the Q-time after the copper seed layer deposition is relaxed. The prolonged Q-time allows performing barrier-seed treatments or metrology operation on the diffusion barrier layer 60 and the copper seed layer 70 to obtain information regarding the continuity and coverage of the diffusion barrier layer 60 and the copper seed layer 70 before performing subsequent processes in the formation of interconnect structures. Because the graphene sacrificial layer 80 is only one- or a few atom layers thick and is optically transparent as well as thermally and electrically conducting, the presence the graphene sacrificial layer 80 will not distort the measurement results.

Figure 6:
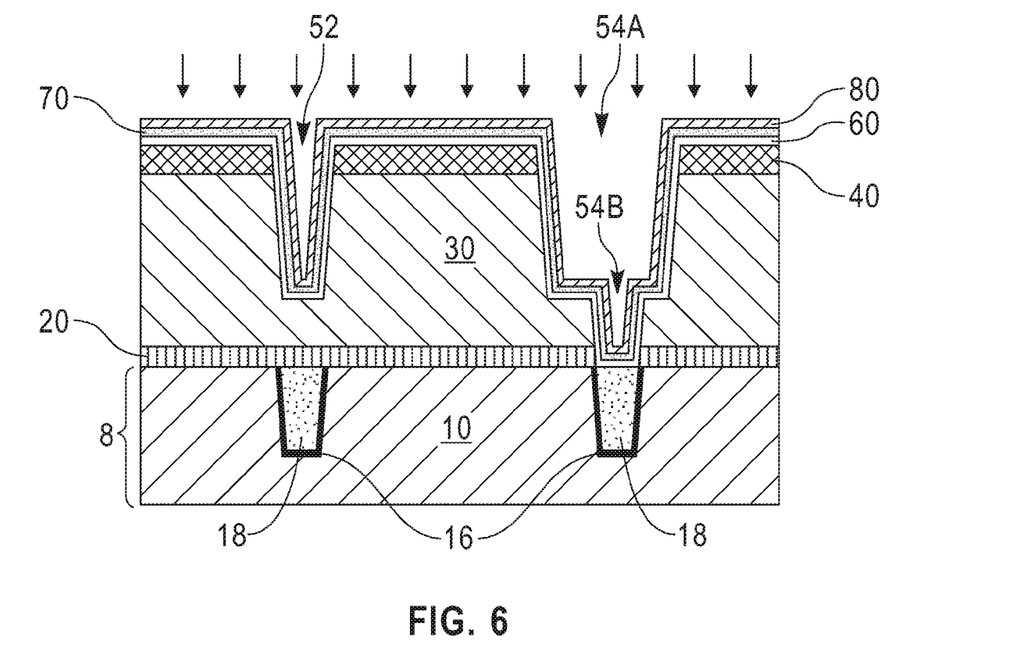
FIG. 6 is a cross-sectional view of the exemplary semiconductor structure of FIG. 5 after subjecting the graphene sacrificial layer to a plasma treatment.

Referring to FIG. 6, a plasma treatment using hydrogen, nitrogen or argon-based gas is performed to treat the graphene sacrificial layer 80. The plasma treatment introduces disorders or defects in the graphene sacrificial layer, thus breaking the continuity of the graphene sacrificial layer 80. Such discontinuity facilitates the removal of the graphene sacrificial layer 80 in the copper plating step subsequently performed.

Figure 7:
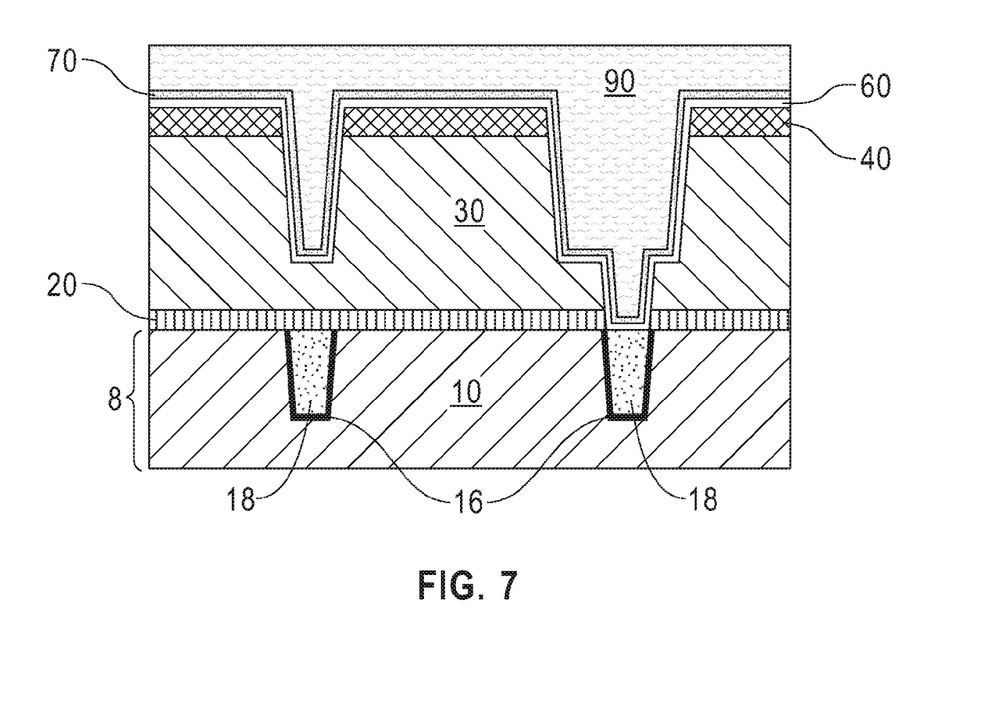
FIG. 7 is a cross-sectional view of the exemplary semiconductor structure of FIG. 6 after forming a copper-containing layer on the copper seed layer to fill the openings.

Referring to FIG. 7, copper plating is carried out to fill the openings 52, 54A, 54B with a copper-containing material to provide a copper-containing layer 90. The semiconductor structure of FIG. 6 is immersed in a conventional copper electroplating solution which may contain, for example, sulfuric acid ($H_2SO_4$), copper sulfate ($CuSO_4$) and other additives. The plasma treated graphene sacrificial layer 80 is soluble in the acidic copper electroplating solution which leaves an unoxidized surface of the copper seed layer 70 for electroplating of copper. The removal of the plasma treated graphene sacrificial layer 80 thus does not add extra process steps and processing time.

Shown in FIG. 7 is the copper seed layer 70 with the copper-containing material plated directly onto it. The graphene sacrificial layer 80 has been dissolved in the copper plating solution and no longer is a part of semiconductor structure. The copper-based material may be comprised of copper, or a copper alloy, including, for example, copper-aluminum, copper-cobalt, copper-manganese, copper-magnesium, copper-tin and copper-titanium.

Figure 8:
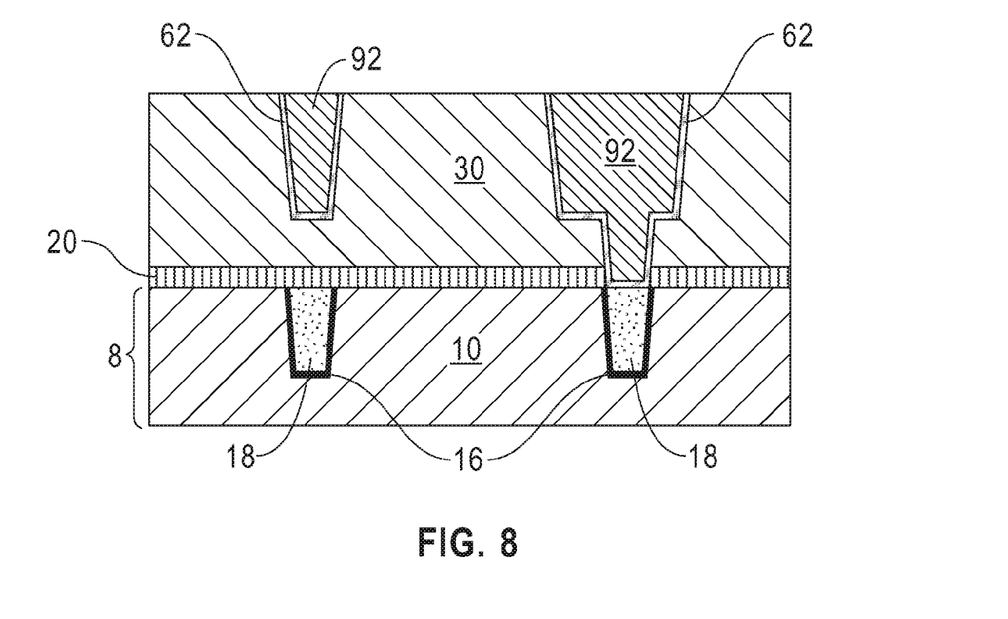
FIG. 8 is a cross-sectional view of the exemplary semiconductor structure of FIG. 7 after planarizing the second diffusion barrier layer, the copper seed layer and the copper-containing layer to provide upper level interconnect structures.

Referring to FIG. 8, once the openings 52, 54A, 54B are completely overfilled with the copper-containing material, portions of the copper-containing layer 90, the copper seed layer 70 and the diffusion barrier layer 60 are removed from the top surface of the second dielectric material layer 30 by chemical mechanical polishing (CMP). The dielectric hard mask layer 40 is also removed after the CMP process. The remaining portion of the diffusion barrier layers 60 in each of the openings 52, 54A, 54B constitutes a second diffusion barrier 62. The remaining portions of the copper seed layer 70 and the plated copper-containing layer 90 in each of the openings 52, 54A, 54B may be merged to form a unitary second conductive structure 92. A second diffusion barrier 62 and a second conductor structure 92 collectively define an upper level interconnect structure laterally surrounded by the second dielectric material layer 30.

Figure 9:
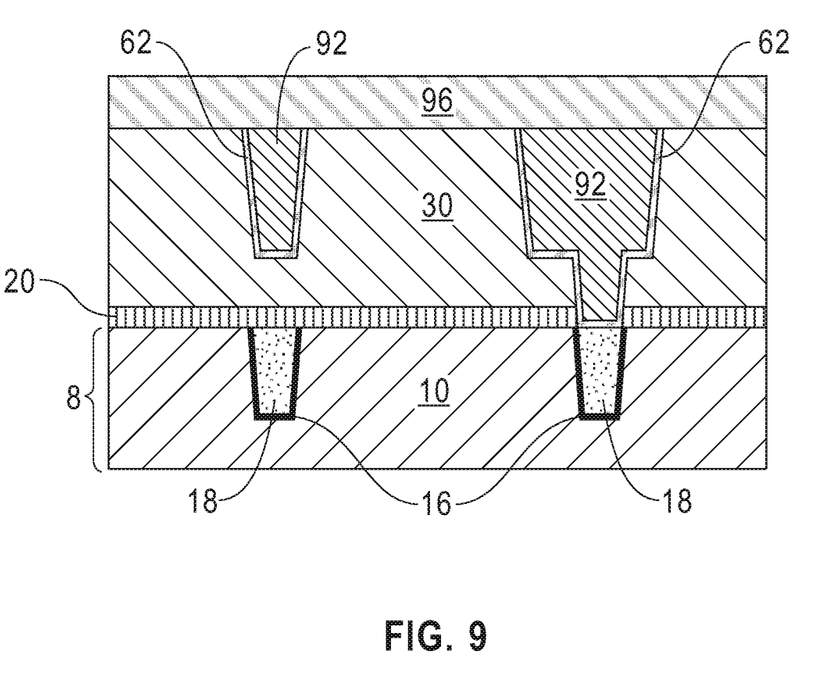
FIG. 9 is a cross-sectional view of the exemplary semiconductor structure of FIG. 8 after forming a second dielectric cap layer over the upper level interconnect structures and a second dielectric material layer in the stack.

Referring to FIG. 9, a second dielectric cap layer 96 is formed over the top surfaces of the second dielectric material layer 30 and the upper level interconnect structures (62, 92). The second dielectric cap layer 96 may include a dielectric material the same, or different from the first dielectric cap layer 20. The second dielectric cap layer 96 may include, for example, silicon nitride, silicon oxynitride, silicon carbide, a nitrogen and hydrogen doped silicon carbide (SiCNH), or a combination thereof. The second dielectric cap layer 96 may be formed, for example, by CVD or ALD.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming an interconnect structure comprising:
   forming at least one opening in at least one dielectric material layer;
   forming a copper seed layer on sidewalls and a bottom surface of the at least one opening;
   forming a graphene sacrificial layer on the copper seed layer;
   subjecting the graphene sacrificial layer to a plasma treatment; and
   contacting the plasma treated graphene sacrificial layer with a copper plating solution, wherein the copper plating solution dissolves the plasma treated graphene sacrificial layer and forms a copper-containing layer on the copper seed layer to fill the at least one opening.

2. The method of claim 1, wherein the graphene sacrificial layer is formed by chemical vapor deposition (CVD), plasma enhanced chemical vapor deposition (PECVD), microwave plasma chemical vapor deposition (MPCVD), or ultraviolet (UV) assisted chemical vapor deposition.

3. The method of claim 2, wherein the graphene sacrificial layer is formed at a temperature no greater than 400° C.

4. The method of claim 3, wherein the graphene sacrificial layer is formed by MPCVD at a room temperature.

5. The method of claim 1, wherein the graphene sacrificial layer comprise a monolayer of graphene.

6. The method of claim 1, wherein the graphene sacrificial layer comprises multilayers containing 2 to 10 monolayers of graphene.

7. The method of claim 1, wherein the graphene sacrificial layer is epitaxial aligned with the copper seed layer.

8. The method of claim 1, further comprising forming a diffusion barrier layer on the sidewalls and the bottom surface of the at least one opening prior to the forming the copper seed layer.

9. The method of claim 8, wherein the diffusion barrier layer comprises Ta, TaN, W, WN, TiN, Ta/TaN, Ta/TaN/Ta, or TaN/Ta.

10. The method of claim 1, wherein the copper seed layer comprises copper or a copper alloy.

11. The method of claim 1, wherein the copper seed layer is formed by CVD, PECVD, atomic layer deposition (ALD), or physical vapor deposition (PVD).

12. The method of claim 1, wherein the plasma treatment comprises exposing the graphene sacrificial layer to a gas comprising hydrogen, nitrogen, or argon.

13. The method of claim 1, wherein the plasma treatment introduces disorders and defects in the graphene sacrificial layer.

14. The method of claim 1, wherein the copper-containing layer comprises copper or a copper alloy.

15. The method of claim 14, wherein the copper alloy comprises copper-aluminum, copper-cobalt, copper-manganese, copper-magnesium, copper-tin, or copper-titanium.

16. The method of claim 1, wherein the at least one dielectric material layer is located on a lower interconnect structure, said lower interconnect structure comprising at least one conductive structures embedded in a first dielectric material layer.

17. The method of claim 16, wherein the at least one dielectric material layer comprises a first dielectric cap layer present on topmost surfaces of the lower interconnect structure and a second dielectric material layer present on the first dielectric cap layer.

18. The method of claim 17, wherein the forming at least one opening in the at least one dielectric material layer comprises:
    forming a dielectric hard mask layer on the second dielectric material layer; and
    patterning the dielectric hard mask layer, the second dielectric material layer and the first dielectric cap layer to provide the at least one opening, the at least one opening exposing a top surface of the at least one conductive structure.

19. The method of claim 1, further comprising removing portions of the copper seed layer and the copper-containing layer from a topmost surface of the at least one dielectric material layer.

20. The method of claim 19, further comprising forming a second dielectric cap layer on topmost surfaces of remaining portions of the copper seed layer and the copper-containing layer and the at least one dielectric material layer.

* * * * *